United States Patent [19]
Hook et al.

[11] Patent Number: 6,022,770
[45] Date of Patent: Feb. 8, 2000

[54] NVRAM UTILIZING HIGH VOLTAGE TFT DEVICE AND METHOD FOR MAKING THE SAME

[75] Inventors: Terence B. Hook, Jericho Center; James S. Nakos; Richard Q. Williams, both of Essex Junction, all of Vt.

[73] Assignee: International Business Machines Corporation, Armonk, N.Y.

[21] Appl. No.: 09/047,155

[22] Filed: Mar. 24, 1998

[51] Int. Cl.[7] ................................................ H01L 21/8238
[52] U.S. Cl. ............................................ 438/211; 257/316
[58] Field of Search .................................... 438/211, 171, 438/170, 166, 149, 142, 162, 517; 257/216, 213, 215, 316

[56] References Cited

U.S. PATENT DOCUMENTS

| | | |
|---|---|---|
| 4,945,067 | 7/1990 | Huang . |
| 4,984,040 | 1/1991 | Yap . |
| 5,073,723 | 12/1991 | Da Costa . |
| 5,267,195 | 11/1993 | Kodama . |
| 5,274,602 | 12/1993 | Glenn . |
| 5,291,440 | 3/1994 | Koyama . |
| 5,315,546 | 5/1994 | Ochii . |
| 5,321,286 | 6/1994 | Koyama et al. . |
| 5,338,956 | 8/1994 | Nakamura . |
| 5,493,139 | 2/1996 | Akiyama et al. . |
| 5,502,673 | 3/1996 | Riggio, Jr. . |
| 5,517,044 | 5/1996 | Koyama . |
| 5,523,970 | 6/1996 | Riggio et al. . |
| 5,550,773 | 8/1996 | Woerlee et al. . |
| 5,620,906 | 4/1997 | Yamaguchi et al. ................. 438/162 |
| 5,897,346 | 4/1999 | Yamaguchi et al. ................. 438/162 |

OTHER PUBLICATIONS

SPIE vol. 2881 pp. 194–200 Entitled: Bonding Techniques For Single Crystal TFT AMLCDs, Author(s): Sonja Van Der Groen, Maarten Rosmeulen, Philippe Jansen, Ludo Determ, Kris Baert.

*Primary Examiner*—Charles Bowers
*Assistant Examiner*—Craig Thompson
*Attorney, Agent, or Firm*—Whitham, Curtis & Whitham; Eugene I. Shkurko

[57] ABSTRACT

Breakdown and latch-up of field effect transistors integrated with non-volatile semiconductor memory cells requiring voltages higher than logic level voltages for write and erase operations is avoided while limiting process complexity and constraints and increasing potential integration density by using thin film transistors for high voltage switching and isolating the thin film transistors from the substrate by forming the thin film transistors on isolation structures extending between or over elements formed at a surface of a substrate or semiconductor layer. Geometry and doping levels of the thin film transistors is thus made independent of geometry and doping levels of the non-volatile semiconductor memory cells and other field effect transistors operating at lower logic-level voltages. In particular, the thickness of a doped semiconductor layer in which an impurity well may be formed can be determined in a manner to optimize performance of transistors operating at logic level voltages rather than the breakdown voltage which must be withstood by transistors used for controlling write and erase operations of the non-volatile memory cells.

18 Claims, 2 Drawing Sheets

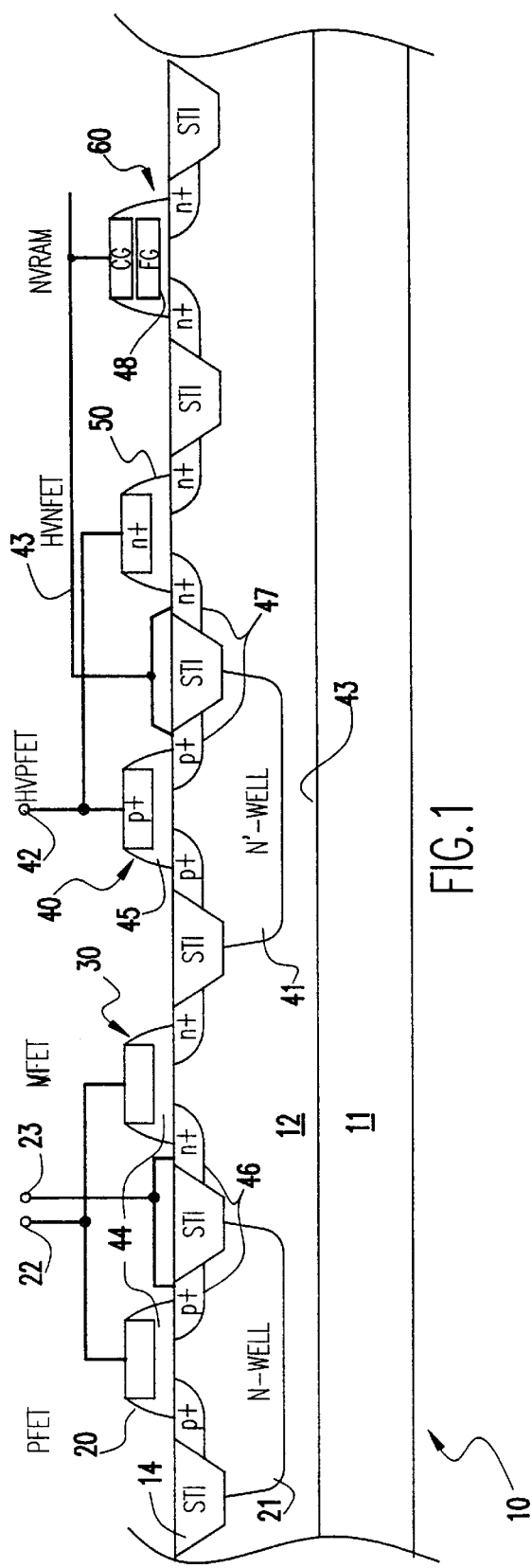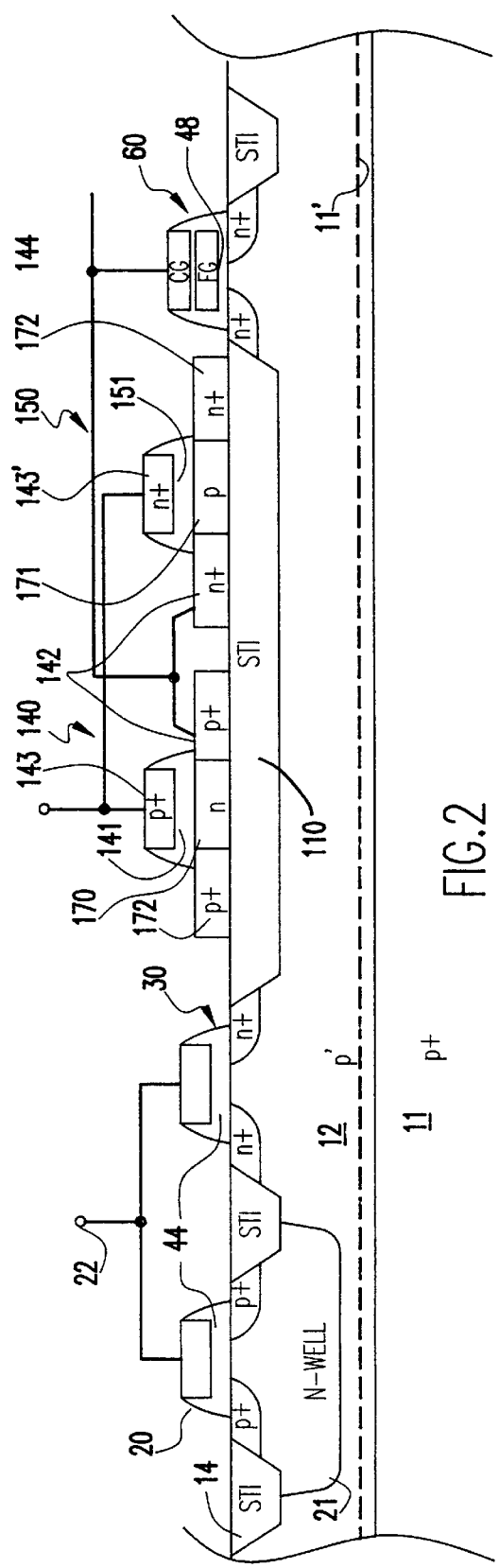

NVRAM UTILIZING HIGH VOLTAGE TFT DEVICE AND METHOD FOR MAKING THE SAME

BACKGROUND OF THE INVENTION

1. Field of the Invention

The present invention generally relates to semiconductor integrated circuit memories and, more particularly, to non-volatile random access memory (NVRAM) structures and methods for their manufacture.

2. Description of the Prior Art

Semiconductor memory structures are well-known and designs thereof have been integrated at high densities, providing, at the present state of the art, several million dynamic memory cells or tens of thousands of static memory cells on a single chip along with addressing, sensing and driving circuits allowing data stored therein to be changed at will. Such memories and the speed of access they allow are indispensable to support the high speed of digital processors presently available. However, the maintenance of storage states of the cells requires at least constant application of at least stand-by power and, for dynamic memory cells, periodic refreshing. Since storage states are not otherwise maintained, such memories are referred to as being volatile.

So-called read only memories (ROMS) are not volatile but the contents thereof cannot be changed. ROMs are, nevertheless, useful for personalization of electronic devices and storage of basic operational programming of processors since they generally support very high speed access. Otherwise, other storage media such as magnetic disks, bubble memories and the like have generally been used for non-volatile storage of data when the capability of changing the data must be provided even though access to the data is generally much slower.

To partially overcome the slower access time of other storage devices and media, various caching schemes have been developed which are, in general, quite effective to support the function of available high speed processors. Nevertheless, delays may be encountered when data required by the processor is not present in the cache. Further, use of a cache does not provide freedom from other characteristics of the storage medium utilized such as the mechanical vulnerability of magnetic disk drives to impact, vibration and the like or the need to expand cache capacity, which, itself, requires a degree of processing overhead, to avoid significant delays due to the number of cache misses which may be encountered and the time required to access the desired amount of information from main storage, particularly as compared with processor cycle time.

Non-volatile semiconductor structures are known and have been referred to as programmable read only memories (PROMs) in view of the fact that data can be electrically written or otherwise programmed therein rather than being established in the course of fabrication of the device, as in ROMs. More recently, designs of PROMs have allowed data to be changed by erasure (e.g. by irradiation) and rewriting and are known as erasable programmable read only memories (EPROMS) or, if the erasure is done electrically, electrically erasable programmable read only memories (EEPROMS). These latter structures generally employ electron tunneling phenomena through a thin dielectric layer. Each tunneling operation, however, causes a finite amount of damage to the dielectric and the number of write and erase cycles before failure has been limited. Accordingly, these devices continue to be applied and referred to as various forms of read only memories (i.e. EEPROMs or flash EEPROMs if all cells of a partition of the memory are simultaneously erased) since they are intended for applications in which data will be changed only rarely.

More specifically, memory cells of EEPROMs generally include a structure similar to that of a field effect transistor but have an insulated floating gate electrode to which a control gate is capacitively coupled. Thus, a small voltage on the control gate together with presence or absence of charge stored on the floating gate can allow the reading of the cell while larger voltages on the control gate cause tunneling of electrons from the conduction channel to or from the floating gate for writing or erasure of the EEPROM cell.

Very recently, some electron tunneling mechanisms have been exploited in which the damage to the dielectric during write and/or erase operations is very much reduced. Together with improvements in dielectric quality and distribution of such operations over the memory array, the number of write and erase operations which can be accomplished before device failure has become sufficient to the anticipated service lifetime of computers in which such memories may be employed. Thus such devices can be used much in the manner of random access memories and have thus come to be referred to as non-volatile random access memories (NVRAMs). The number of NVRAM storage cells which may be provided on a single chip has also become comparable to that of at least static RAMs and has begun to approach that of dynamic RAMs.

Tunneling effects on which NVRAMs continue to rely for write and erase operations, however, requires a higher voltage than is required for read operations while high integration density requires small sizes of the memory cells and has led to reduction of logic level voltages used for read operations and other logic functions which may be included on the chip. To avoid breakdown, latch-up and other known types of malfunctions when the higher voltages are applied, isolation structures are generally required between NVRAM cells and write and erase voltages are kept as low as possible to ensure correct operation.

To provide adequate isolation structures in as small an area as possible so-called recessed oxide (ROX) and shallow trench isolation (STI) structures which extend into the substrate and often above the surface of the substrate are generally employed. The floating gate and control gate structures are generally formed to extend along the surface of the isolation structures to provide sufficient coupling ratio of the floating gate and control gate capacitances for reliable operation at a minimized high voltage. Formation of such structures generally requires substantially different processes from those required to form other switching elements having a lower voltage (e.g. limited to approximately the logic-level voltage swing) applied thereto for address decoders, logic, transmission gates, logic voltage level shifters and the like or even complete general purpose processors or special purpose macros on the same chip, generally in a complementary metaloxide-semiconductor (CMOS) technology currently preferred.

More importantly to the manufacturing process at high integration densities, transistors in CMOS and other technologies cannot be formed at minimum size and proximity consistent with tolerating the high voltages required for write and erase operations of EEPROM/NVRAM cells. While many high voltage transistor structures, including CMOS technologies, are known, electrical and structural requirements differ greatly in dependence on the voltage at which they must operate.

For example, in low voltage CMOS (complementary metal-oxide-semiconductor) devices generally used for logic, one transistor of each complementary pair of transistors is formed in an impurity well in a doped substrate or layer of a conductivity type opposite that of the well and a reference, bias or control voltage is applied to the substrate and well to improve off-current and other electrical characteristics of the device. When larger voltages are applied to electrodes of either transistor of a complementary pair of CMOS high voltage driver transistors formed on the same substrate or well, even if dimensioned to withstand the larger voltage, breakdown of the source or drain junctions to the substrate or impurity well, breakdown of the gate oxide, breakdown of the impurity well to the substrate and latch-up can occur unless prevented by other structures which heretofore have involved numerous and/or costly process steps and which may possibly reduce performance. For instance, a thicker epitaxial layer below the high voltage impurity well may affect performance (e.g. aggravate latch-up) of low voltage CMOS devices if not the high voltage devices. The area required for the larger high voltage devices is also a limiting factor in the degree of integration density which can be achieved.

Thin film field effect transistors (TFTs) are also known and familiar to those skilled in the art. Such transistors differ somewhat in structure from transistors formed in accordance with CMOS technology and have relatively lower current drive capability than CMOS transistors of comparable dimensions. Generally, such transistors are formed on an insulative substrate and no reference, bias or control voltage is applied to any structure below the conduction channel which is formed in a doped conductive layer deposited over an insulator. Further, the formation of junctions, doping profiles and gate oxide thicknesses of TFT devices may be specifically designed to withstand and optimally function at the required higher voltages and thus may be very much at variance with the structures which must be formed for lower voltage CMOS logic transistors.

SUMMARY OF THE INVENTION

It is therefore an object of the present invention to provide an integrated circuit structure allowing space-efficient and process-efficient integration of NVRAM cells, lower voltage CMOS circuits and high voltage thin film transistor driver circuits.

It is another object of the invention to provide an integrated circuit structure allowing maximal integration density of NVRAM cells and low voltage logic while including high voltage drivers therein.

It is a further object of the invention to provide an integrated circuit structure in which high voltage signals and supplies are completely isolated from structures formed on the substrate or doped semiconductor layers thereon except at the control gates of NVRAM cells.

In order to accomplish these and other objects of the invention, a semiconductor integrated circuit is provided comprising a non-volatile semiconductor memory cell formed at a surface of a substrate or semiconductor layer, an isolation structure formed at a surface of the substrate or semiconductor layer, and a complementary pair of thin film transistors formed on a surface of the isolation structure and connected to a control gate of said non-volatile semiconductor memory cell.

In accordance with another aspect of the invention, a method of fabricating a non-volatile semiconductor memory device is provided including the steps of forming a non-volatile semiconductor memory cell at a surface of a semiconductor layer, forming an isolation structure at a surface of a semiconductor layer, and forming a complementary pair of thin film transistors on a surface of the isolation structure.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is an idealized cross-sectional view of an integrated circuit structure over which the present invention is an improvement, FIG. 2 is a cross-sectional view of a preferred form of the invention.

DETAILED DESCRIPTION OF A PREFERRED EMBODIMENT OF THE INVENTION

Figure 3:
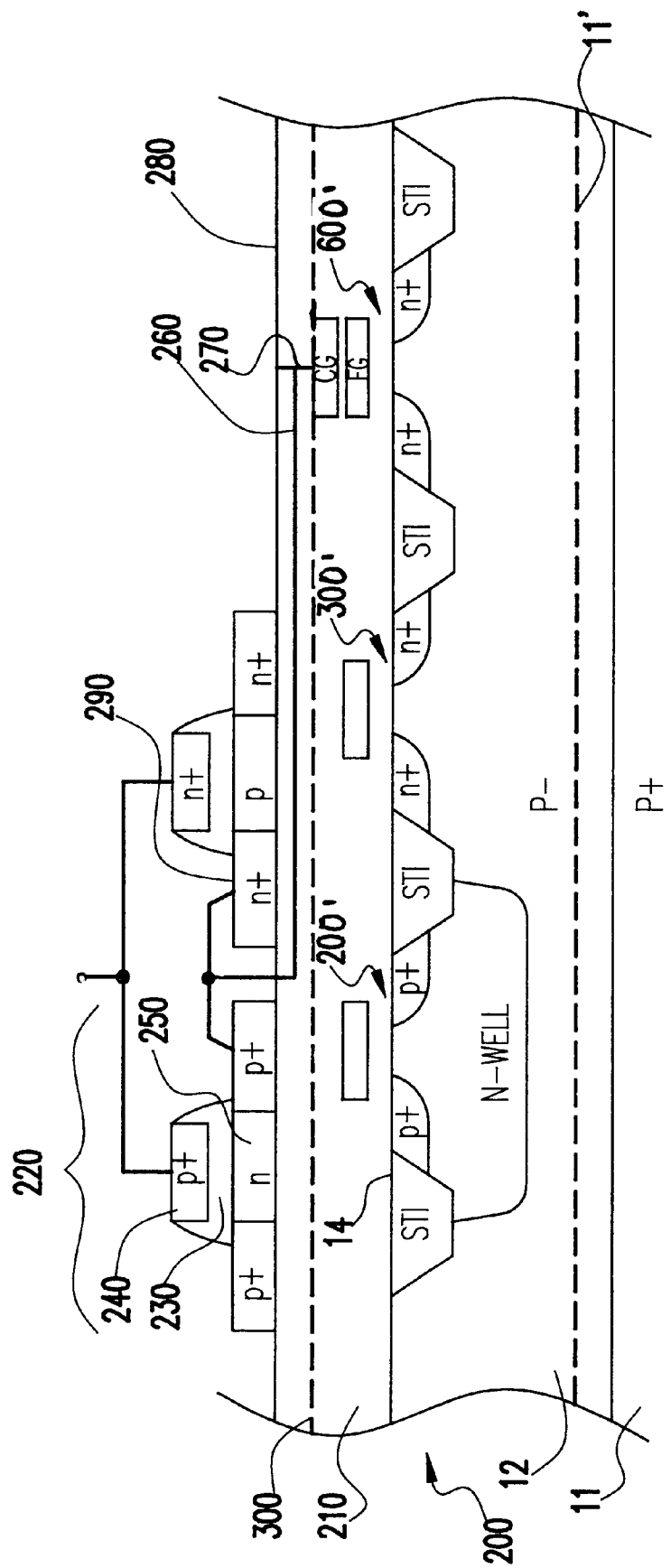
FIG. 3 is a cross-sectional view of a variant form of the invention depicted in FIG. 2.

Referring now to the drawings, and more particularly to FIG. 1, there is shown, in an idealized cross-sectional view, an integrated circuit structure 10 over which the present invention is an improvement. It is to be understood that the structure of FIG. 1 is exemplary in content and the view is arranged to facilitate an understanding of the present invention. Accordingly, no portion or feature of FIG. 1 is admitted to be prior art as to the present invention.

Integrated structure 10 includes a p+ doped semiconductor layer 11 which may be a substrate or a layer on a substrate not otherwise shown. A more lightly doped p− layer 12 is formed thereover in which the active devices will be formed. The p+ layer provides protection against latch-up and forms a low resistance ground plane.

Five exemplary devices are depicted as being formed on the surface of layer 12: a complementary pair of CMOS transistors including PFET 20 and nFET 30 as would be employed for low voltage logic, level shifters, macros or processors as alluded to above, a complementary high voltage driver pair of transistors comprising HVPFET 40 and HVNFET 50 and a NVRAM cell 60. While not at all important to the practice of the invention, exemplary common input connections 22, 42, and output connections 23, 43, of the low voltage and high voltage complementary transistor pairs is shown to facilitate an understanding of the relative function of the different transistor types illustrated. The latter (high voltage) is illustrated as connected to the control gate of the NVRAM cell, as would generally be the case. Output 23 may also be connected to input 42 of the high voltage driver pair if sufficient voltage swing is available or, more generally, to inputs of a level shifter possibly formed as a series connected plurality of transistors similar to transistors 20 and 30 which would, in turn, drive input 42 from a voltage supply sufficiently higher than the logic level supply to provide the necessary voltage swing to driver pair 40, 50.

It should be noted from FIG. 1 that each of the devices 20, 30, 40, 50 and 60 are separated from each other by shallow trench isolation (STI) 14 which is depicted as being formed within the layer 12 with a surface coplanar with a surface of layer 12. The details of the isolation structure are not particularly important to the practice of the invention or the structure of FIG. 1. A recessed oxide (ROX) isolation structure (which would generally protrude above the surface of layer 12) could also be used. Both types of isolation structures are well-understood in the art and details thereof are not important to the practice of the invention or the structure of FIG. 1.

It should also be noted that pFET 20 and HVPFET 40 are both formed in impurity wells 21 and 41, respectively. Due to the different voltages which must be withstood and which must be switched by the respective devices, both the depths of the impurity wells 21, 41, and their respective dopant/ impurity concentrations may be markedly different from each other and thus require discrete masking and processing steps for their formation. Specifically, the thickness of layer 12 is determined by the voltage breakdown requirement for n-well 41, even though the thickness of layer 12, thus determined, is greater than the optimum thickness in regard to n-well 21.

Similarly, the gate insulators (e.g. 45) of the high voltage driver pair 40, 50, will be of markedly different thickness than the gate insulator 44 of the CMOS low voltage logic transistor pair 20, 30, as will the respective source and drain dopant concentrations and distributions 46 and 47, all of which will require separate masking and processing steps to form. Generally, these device features will be different for the NVRAM cells, as well, particularly for tunneling oxide layer 48.

Accordingly, it can be readily understood that while these devices 20–60 are generally similar in gross structural features such as having impurity wells for the complementary conductivity type transistor of transistor pairs, a gate oxide and doped source and drain regions, numerous process complications are presented by differences in geometry and dopant/impurity concentrations required for particular ones of these respective features.

In any event, it can be appreciated that the structure of FIG. 1 requires substantial area for formation of the different types of devices depicted (which may be exacerbated by wider STI structures adjacent the high voltage transistors 40, 50) and that the structure may be subject to breakdown from the source/drain regions or the impurity wells to the substrate or latch-up when high voltage is applied since all the devices depicted are formed on a common substrate to which a reference, bias or control voltage is applied. Further, the thickness of portions of layer 12 extending between impurity wells 21 and 41 and substrate or layer 11 cannot both be optimized for best transistor performance consistent with adequate resistance to breakdown, latch-up and the like.

Referring now to FIG. 2, a preferred embodiment 100 of the invention which avoids potential problems of breakdown and latch-up as well as allowing optimization of the thickness of layer 12 relative to impurity well 21 is shown in exemplary cross-sectional form. Since breakdown and latch-up problems are inherently avoided in this embodiment of the invention (as well as the variant form thereof illustrated in FIG. 3), substantial design and manufacturing process flexibility is also provided by the invention. It should be understood that the depiction of FIG. 2 is arranged to facilitate comparison with the illustration of FIG. 1 and no preference or criticality in regard to layout or features of any particular device employing the invention is to be inferred therefrom.

Specifically, in contrast to the embodiment of FIG. 1, a large shallow trench isolation structure 110 is provided. A recessed oxide structure could also be employed, as alluded to above. The structure of transistors 20, 30, and NVRAM cell 60 are depicted as being precisely the same as in FIG. 1 since they need not differ in any way therefrom although the details of their structure is not critical to the invention and other structural variations thereon could be employed in accordance with the principles of the invention. It should be further noted that while substrate 11 may also be identical to that of FIG. 1, the thickness of layer 12 may ideally be, for example, thinner than that depicted in FIG. 1 as indicated by dashed line 11' of FIGS. 2 and 3 since a large voltage need not be accommodated by a thickness in excess of the depth of the n-well 41, as discussed above, and thus the thickness of layer 12 may be optimized in accordance with the depth of n-well 21.

Isolation structure 110, being an insulator/non-conductor, serves to isolate high voltages applied to thin film transistors 140, 150, from the substrate and thus avoids problems of latch-up or breakdown of any element of the thin film transistors to the substrate. Further, no impurity well is necessary to support either conductivity type of the thin film transistor complementary pair. Thus, both criticality of the formation of an impurity well and breakdown from the well to the substrate 11, 12 are avoided.

Since the thin film transistors are formed on isolated islands of oxide, substantial design and process latitude are provided. For example, gate oxides 141, 151, of the TFTs 140, 150, can be grown or deposited, at will, to any desired thickness without significant effect on gate insulators 44 of the CMOS transistors 20, 30, or tunnelling gate oxide 48 and vice-versa. Similarly, the doping of the bodies of the high voltage TFTs 170, 171 and the source/drain regions 142, 172 may be established (e.g. by block-out masking having wide registration tolerances) independently of the doping of layer 12 or the doping of n-well region 21.

It is to be understood that in the above described preferred embodiment of the invention shown in FIG. 2 and the following description of a variant form thereof, the formation of the respective devices is not critical or even particularly important to the practice of the principles of the invention and numerous suitable designs and processes for the fabrication thereof are well-known and familiar to those skilled in the art. The advantages which accrue in regard to freedom from breakdown and latch-up, process simplification and increased latitude of design and manufacturing processes are completely independent of the processes required for formation of any of the types of devices depicted or the details of their respective designs. Further, the high voltage is completely decoupled from structures formed on the substrate other than the connection to the control gate of the NVRAM cells which they are necessarily designed and fabricated to withstand.

Referring now to FIG. 3, a variant form of the preferred embodiment of the invention is shown in cross-section. The structures of transistors 20', 30' and NVRAM cells 60' are substantially the same as transistors 20, 30 and NVRAM cells 60 in FIGS. 1 and 2 except that the respective gate structures thereof are encapsulated in oxide layer 210 which also serves as an isolation structure over the entirety or any desired portion of layer 12 and structures formed thereon. Impurity well 21 and isolation structures (e.g. STI structures 14) are also depicted in the same fashion as in FIG. 1 and portions of FIG. 2 but, as before, are not at all critical or particularly important to the practice of the principles of the invention. As indicated above, ROX structures could also be used.

In contrast to the embodiment of FIG. 2, however, the variant form of the invention shown in FIG. 3 forms only the low voltage logic CMOS transistors 20', 30' and NVRAM cells 60' on the surface of the substrate or layer 12. These devices are then covered (e.g. by oxidation or deposition) with a relatively thick layer of oxide 210 which may be planarized, if desired, to facilitate and enhance resolution of lithographic processes, and the high voltage thin film devices formed thereon. It is also possible, for example, to grow or deposit an oxide on another monocrystalline wafer or chip, bond the wafer or chip oxide-to-oxide over the CMOS and memory cell structures (as generally indicated by dashed line 300 in isolation structure 210) and etch back the top wafer to yield a thin monocrystalline layer for formation of the thin film transistors in the same manner as described above. The transistors so formed will provide enhanced performance by virtue of the monocrystalline structure of the remaining thin layer which may justify the increase of process complexity. Suitable bonding techniques to form such a structure have recently become known for bonding transferring transistors to glass for flat liquid crystal display panels and are described, for example, in "Bonding Techniques for single crystal TFT AMLCDs" by van der Groen et al., Proceedings of the conference: Microelectronic Structures and MEMs for Optical Processing, Austin, Tex. Oct. 14–15, 1996. SPIE—Int. Soc. Opt. Eng. (USA) Vol. 2881, pp. 194–200, which is hereby fully incorporated by reference. The high voltage complementary thin film transistor devices may then be formed thereon by processes well-known and familiar to those skilled in the art or other processes which may be found suitable for thin film devices.

As with the embodiment of FIG. 2, no impurity well need be provided for the thin film devices and criticality of the design thereof in connection with the epitaxial region or layer 12 as well as breakdown and latch-up problems which are associated therewith are avoided. Likewise, particularly since the TFT devices can be formed using a relatively low heat budget, there is no significant effect of TFT manufacturing processes on the source/drain geometry or dopant concentrations or the gate insulator or floating gate oxide quality or thickness.

It can also be appreciated that while the variant form of the invention shown in FIG. 3 provides all the advantages of the embodiment of FIG. 2, area need not be reserved for the TFT devices on the substrate or layer formed thereon and virtually the entire area of the chip can be used for the TFT devices, if needed, since an additional layer 210 is provided for doing so. This additional area can include level shifting circuits (also allowing them to be removed from the substrate layout) since the number of required high voltage drivers is usually relatively low and the area at another level can be advantageously utilized to form the TFT devices at somewhat larger size to compensate for their characteristically lower current drive capability.

In view of the foregoing, it is seen that the invention provides for decoupling the manufacturing processes and designs of the low voltage CMOS and NVRAM cells from those necessitated to form high voltage devices on the same chip. Thus, design trade-offs and process inconsistencies between the types of devices are avoided, enhancing design and process flexibility, while providing inherent avoidance of breakdown and latch-up phenomena and device degradation incident thereto. Likewise, all high voltage signals are completely decoupled from devices formed on the substrate or doped semiconductor layer formed thereover other than at the control gate electrode of the NVRAM cells.

It should also be noted that whether or not relatively lower current drive capability of TFT devices is compensated, current drive is relatively less important for driving NVRAM cells since these devices require maximum current only for erasure of the NVRAM cells and write cycle times may be extended without significant compromise of the overall performance of the NVRAM structure.

These meritorious effects of the invention are achieved at little net cost in manufacturing process variations. For example, a conventional process to form a NVRAM as illustrated in FIG. 1 may require as many as four additional mask/implant steps or process sequences which require close registration tolerances: HVPFET body doping, HVPFET source/drain doping, HVNFET body doping and HVNFET source/drain doping, and one additional gate oxidation step to create the two high voltage devices. The details of the processes may require even more steps or may allow some fortuitous combinations of processes to somewhat reduce the number of such steps. In any event, close registration tolerances are necessary and, since the structure of FIG. 1 cannot be optimized in regard to n-well depth, as alluded to above, small windows of process variation are imposed and maufacturing yield may be compromised.

A structure such as is illustrated in FIGS. 2 and 3 may be created with little or no additional process cost (compared with the structure of FIG. 1). Even in the event that no savings at all were to be realized by combining processes with the conventional CMOS processes, in addition to the extra processes noted above, two additional films for the TFT body and TFT gate, including masks to define these structures, would be required. However, both the embodiment of FIG. 2 and, especially, the variant form of FIG. 3 reduce the registration tolerances required for such additional processes, allow optimization of the different structures and reduce criticality of processing.

In order to create the structure illustrated in FIG. 2, the following process sequence may be followed: after completion of the low voltage CMOS devices and the NVRAM cells, a layer of amorphous silicon can be deposited to a preferred thickness of about 0.2 $\mu$m and etched to define the high voltage device regions (e.g. 170, 172 and 142). Implant masks may then be applied and implant processes carried out to define doping of device body regions 170, 171 for the HVPFET and HVNFET devices and a gate oxide 141, 151 deposited. Then, gate polysilicon 143, 143' is deposited and patterned and further source and drain implants performed in a self-aligned manner therewith followed by annealing to activate the implanted dopant. Further processing for completion of the device by conventional processing may then be performed.

In order to create a structure as illustrated in FIG. 3, all processing including a contact 270 on planar insulator (e.g. oxide) surface 280 is performed in a conventional manner. Amorphous silicon is then deposited on surface 280 and definition and formation of the high-voltage TFTs proceeds as described above. A subsequent insulating (e.g. passivation) layer (not shown) may then be deposited and contact apertures etched to connect to the TFT terminals 240, 260 as well as NVRAM cell contact 270.

It should be noted that the embodiment of the invention shown in FIGS. 2 and 3 are illustrated at a state of completion prior to application of the first metal layer, by which desired connections between the low voltage CMOS (and level shifters, if included), the high voltage TFT transistors and the NVRAM cells may be formed. Alternatively, some connections may be carried out within the layer 210, as depicted at 260, as may be desired, or by placing a TFT device terminal (e.g. 290) directly over (e.g. aligned with) a CMOS or NVRAM cell contact (e.g. 270). This latter expedient may be particularly advantageous in connection with the form of the invention shown in FIG. 3 as integration density is increased since a planarized surface can be utilized to develop fine conductor pitch as well as providing an additional surface on which conductors may be placed. Additionally, a somewhat more robust connector structure will be formed and connections to the high voltage transistors may be potentially shortened and simplified.

While the invention has been described in terms of a single preferred embodiment and a variant form thereof, those skilled in the art will recognize that the invention can be practiced with modification within the spirit and scope of the appended claims. For example, different forms of NVRAM cell can be formed at different levels relative to a surface of a substrate or semiconductor layer without departing from the principles of the invention in forming high voltage switching devices as thin film transistors isolated from the substrate by a layer of insulating material overlying or partially within the substrate or semiconductor layer as either an isolation structure or a blanket layer thereon.

Having thus described our invention, what we claim as new and desire to secure by Letters Patent is as follows:

1. A semiconductor integrated circuit comprising
   a non-volatile semiconductor memory cell formed at a surface of a substrate or semiconductor layer,
   an isolation structure formed at a surface of said substrate or semiconductor layer, and
   a complementary pair of thin film transistors formed on a surface of said isolation structure and connected to a control gate of said non-volatile semiconductor memory cell.

2. A semiconductor integrated circuit as recited in claim 1, wherein said isolation structure is a shallow trench isolation structure.

3. A semiconductor integrated circuit as recited in claim 1, wherein said isolation structure is a layer of insulating material formed over said non-volatile semiconductor memory cell.

4. A semiconductor integrated circuit as recited in claim 3, wherein an element of a thin film transistor of said complementary pair of thin film transistors is formed over an element of said non-volatile semiconductor memory cell.

5. A semiconductor integrated circuit as recited in claim 1, wherein said isolation structure is formed of an oxide.

6. A semiconductor integrated circuit as recited in claim 1, further including
   a field effect transistor formed at said surface of said substrate or semiconductor layer with said non-volatile semiconductor memory cell.

7. A semiconductor integrated circuit as recited in claim 6, wherein said isolation structure is a shallow trench isolation structure.

8. A semiconductor integrated circuit as recited in claim 6, wherein said isolation structure is a layer of insulating material formed over said non-volatile semiconductor memory cell.

9. A semiconductor integrated circuit as recited in claim 8, wherein an element of a thin film transistor of said complementary pair of thin film transistors is formed over an element of said non-volatile semiconductor memory cell.

10. A semiconductor integrated circuit as recited in claim 1, wherein an element of a thin film transistor of said complementary pair of thin film transistors is monocrystalline.

11. A semiconductor integrated circuit as recited in claim 6, wherein
   write and erase operations of said non-volatile semiconductor memory cell are controlled by a voltage switched by said complementary pair of thin film transistors, and
   said field effect transistor includes an impurity well in said semiconductor layer, a thickness of said semiconductor layer exceeding a depth of said impurity well by a distance determined in accordance with a breakdown voltage which is less than said voltage switched by said complementary pair of thin film transistors for controlling said write and erase operations of said non-volatile semiconductor memory cell.

12. A method of fabricating a non-volatile semiconductor memory device including the steps of
   forming a non-volatile semiconductor memory cell at a surface of a semiconductor layer,
   forming an isolation structure at a surface of a semiconductor layer, and
   forming a complementary pair of thin film transistors on a surface of said isolation structure.

13. A method as recited in claim 12, wherein said step of forming an isolation structure includes the step of
   forming an oxide in a trench in said semiconductor layer.

14. A method as recited in claim 12, wherein said step of forming an isolation structure includes the step of
   forming an insulating layer over said non-volatile semiconductor memory cell.

15. A method as recited in claim 12, including the further step of
   forming a field effect transistor at said surface of said semiconductor layer.

16. A method as recited in claim 12, including the further steps of
   forming said semiconductor layer to a first thickness,
   forming an impurity well in said semiconductor layer, and
   forming a field effect transistor at said surface of said semiconductor layer at a location of said impurity well.

17. A method as recited in claim 14, wherein said step of forming said complementary pair of thin film transistors includes the step of
   forming an element of a thin film transistor of said complementary pair of thin film transistors over an element of said non-volatile semiconductor memory cell.

18. A method as recited in claim 12, including the further steps of
   forming an oxide on a monocrystalline substrate separate from said semiconductor layer,
   bonding said oxide on said monocrystalline substrate to said isolation structure,
   etching said monocrystalline substrate to form a monocrystalline film, and
   forming said complementary pair of thin film transistors to include said monocrystalline film.

* * * * *